United States Patent
Kobayashi (10) Patent No.: US 8,040,019 B2
(45) Date of Patent: Oct. 18, 2011

(54) DRIVER AND DRIVING METHOD (75) Inventor: Daisuke Kobayashi, Sayama (JP)

(73) Assignee: Texas Instruments Incorporated, Dallas, TX (US)

( * ) Notice: Subject to any disclaimer, the term of this patent is extended or adjusted under 35 U.S.C. 154(b) by 189 days.

(21) Appl. No.: 12/613,163

(22) Filed: Nov. 5, 2009

(65) Prior Publication Data

US 2010/0117484 A1  May 13, 2010

(30) Foreign Application Priority Data

Nov. 5, 2008 (JP) ................... 2008-284095

(51) Int. Cl.
*H01L 41/08* (2006.01)
(52) U.S. Cl. .................................................. 310/319
(58) Field of Classification Search .................. 310/319, 310/317, 316.01
See application file for complete search history.

(56) References Cited

U.S. PATENT DOCUMENTS

| | | | | |
|---|---|---|---|---|
| 5,376,854 A * | 12/1994 | Oouchi | ..................... | 310/316.01 |
| 6,144,139 A * | 11/2000 | Noma et al. | ............. | 310/316.01 |
| 6,183,426 B1 * | 2/2001 | Akisada et al. | .................... | 601/2 |
| 6,198,198 B1 * | 3/2001 | Fujimura et al. | ......... | 310/316.01 |
| 6,246,153 B1 * | 6/2001 | Bishop et al. | ................. | 310/318 |
| 7,352,107 B2 * | 4/2008 | Micko | ....................... | 310/316.01 |
| 7,408,290 B2 * | 8/2008 | May et al. | ..................... | 310/334 |

\* cited by examiner

*Primary Examiner* — Mark Budd
(74) *Attorney, Agent, or Firm* — John J. Patti; Wade J. Brady, III; Frederick J. Telecky, Jr.

(57) ABSTRACT

Conventional drivers for transducers oftentimes did not provide an efficient driving mechanism because the driving signal was not "close enough" to the natural frequency of the transducer. Here, a driver for a transducer is provided that measures the natural frequency of the transducer and generates a driving signal accordingly. Thus, a more efficient driver is provided.

6 Claims, 5 Drawing Sheets

DRIVER AND DRIVING METHOD

CROSS-REFERENCE TO RELATED APPLICATIONS

This application is claims priority to Japanese Patent Appl. No. 2008-284095 filed on Nov. 5, 2008, which is hereby incorporated by reference for all purposes.

TECHNICAL FIELD

The invention relates generally to piezoelectric driver and, more particularly, to a driver for a piezoelectric fan.

BACKGROUND

In recent years, there has been demand for high performance portable devices that are also aesthetically pleasing. Consequently, because electronics (including integrated circuit or ICs) have been confined to small housings, heat dissipation for these ICs has become an issue. Conventional fans used in computers and other applications generally use impellers to generate air flow for heat dissipation, but forced air impeller fans are impractical for compact, high performance devices due to size, power constraints, and noise. Therefore, small fans using piezoelectric elements have been studied as replacements for conventional forced air impeller fans.

Figure 1A:
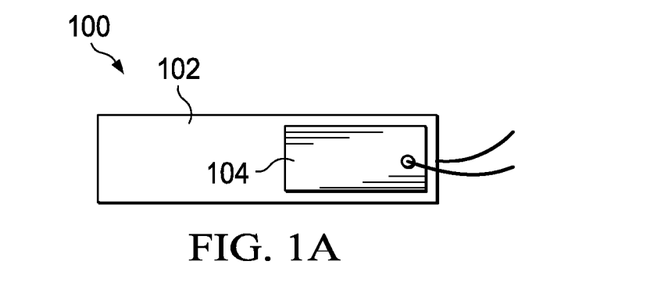
FIG. 1A is a plan view of a piezoelectric fan.
Figure 1B:
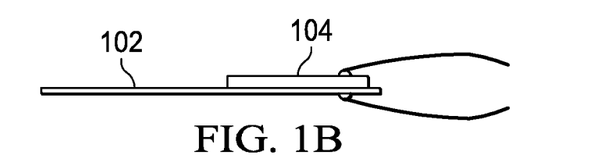
FIG. 1B is an elevation view of the piezoelectric fan of FIG. 1A.
Figure 1C:
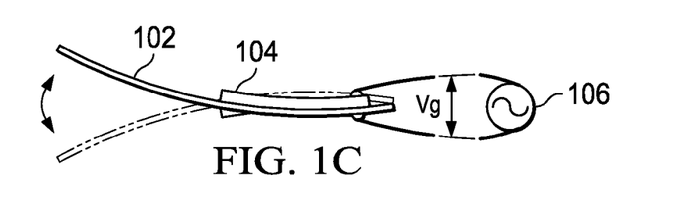
FIG. 1C is a plan view of the piezoelectric fan of FIG. 1A in operation.
Figure 1D:
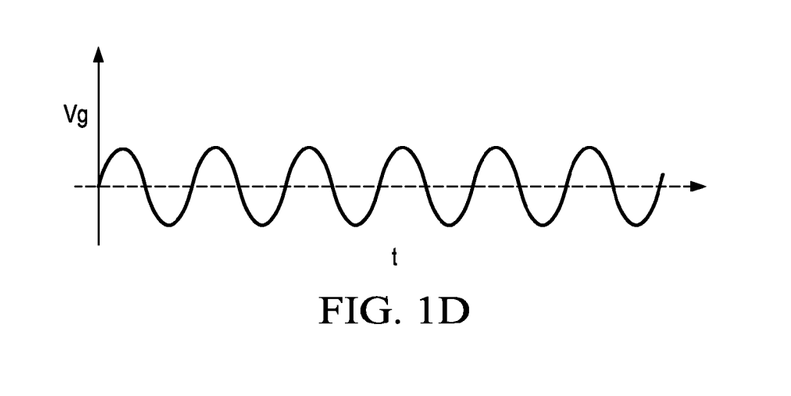
FIG. 1D is a diagram of the voltage versus time for the alternating current (AC) of the piezoelectric fan of FIG. 1A.

Turning to FIGS. 1A through 1D, a piezoelectric fan 100 can be seen. Fan 100 is generally comprised of a piezoelectric element 104 that is secured to a generally rectangular metal sheet 102 and which is driven by alternating current (AC) source 106. As can be seen, piezoelectric element 104 is secured to one end of 102, leaving the opposite end free. When driven by a sine wave from AC source 106 shown in FIG. 1D, the free end of the sheet 102 vibrates (as shown in FIG. 1C). As shown, a piezoelectric fan is structurally simple, which smaller, consumes less power, and is quieter than convention forced air impeller fans.

Fan 100 has a natural frequency or mechanical resonance frequency based on physical characteristics. When an AC voltage from source 106 at a frequency equal to the natural frequency of fan 100 is supplied, the vibrational amplitude of sheet 102 is at a maximum, and when the frequency of the AC voltage from source 106 is a slightly different from the natural frequency of sheet 102, the vibrational amplitude falls off drastically. Therefore, to drive the fan at a high efficiency, the frequency of the AC voltage from source 106 should match the natural frequency of the fan 100.

SUMMARY

From a first viewpoint, the present invention provides a driver characterized by the fact that the driver is for driving an element that receives electric energy and generates mechanical or electrical vibration, and it has the following parts: a driving part that supplies a driving signal at a preset period or frequency to the element in a driving mode, and that stops the supply of the driving signal to the element in a measurement mode, a detecting part that detects the period or frequency of the free vibration generated in the element in the measurement mode, and a control part that alternately switches the operating mode between the driving mode and the measurement mode, and simultaneously, adjusts the period or frequency of the driving signal in the driving mode so that it approaches the detection result of the detecting part in the measurement mode.

The driving mode in which the driving signal is supplied to the element and the measurement mode in which the supply of the driving signal is stopped and the period of the free vibration generated in the element is detected are performed alternately and repeatedly by the driver, and the period of the driving signal in the driving mode is adjusted so that it is near the detection result of the free vibration period of the element in the measurement mode.

As a preferable scheme, the detecting part detects the period or frequency of the electric signal generated by the element in the free vibration.

As a preferable scheme, the driving part takes the output of the driving signal as a high impedance state in the measurement mode, and the detecting part inputs the electric signal to the element via the supply line of the driving signal.

As a preferable scheme, the control part sets the period or frequency of the driving signal in the driving mode based on the detection result of the detecting part in the measurement mode just before the driving mode, or based on the detection result of the detecting part in the measurement mode performed as a series of plural repeated rounds just before the driving mode.

As a preferable scheme, when the difference between the setting value of the period or frequency of the driving signal in the driving mode and the detection value of the detecting part in the measurement mode just after the driving mode exceeds a first threshold, the control part switches the operating mode to the measurement mode after output of the driving signal of N cycles (N is an integer of 1 or larger) in the driving mode.

As a preferable scheme, when the difference is below the first threshold, the control part switches the operating mode to the measurement mode after output of the driving signal of a predetermined number of cycles larger than the N cycles in the driving mode, or switches the operating mode to the measurement mode after output of the driving signal for a predetermined time longer than the N cycle period in the driving mode, or locks the operating mode in the driving mode.

As a preferable scheme, the control part outputs a signal indicating abnormal vibration of the element when the driving mode that outputs the N cycles of driving signal is repeated continuously for a predetermined number of rounds or a predetermined time.

As a preferable scheme, the control part operates as follows: when the detection value is outside a predetermined range, the period or frequency of the driving signal in the next the driving mode is set at a predetermined lower threshold or upper threshold; then, during the period until the difference falls below the first threshold, if the detection value is outside the predetermined range, the period or frequency of the driving signal in the next driving mode is changed by a predetermined increment or decrement with respect to the period or frequency of the driving signal in the driving mode in the last round.

As another scheme that may be adopted, the control part operates as follows: if the difference is over a second threshold larger than the first threshold, the period or frequency of the driving signal in the next the driving mode is set at a predetermined lower threshold or upper threshold; then, during the period until the difference falls below the first threshold, if the difference is over the second threshold, the period or frequency of the driving signal in the next the driving mode is changed by a predetermined increment or decrement with respect to the period or frequency of the driving signal in the driving mode of the last round.

As a preferable scheme, at the start of the driving mode, the control part matches the phase of the driving signal at the start to a phase that can be held by the driving signal in the last round of the driving mode.

As a preferable scheme, the driver has a binary value formation part that converts the electric signal to a binary signal. Here, the detecting part detects the time interval between the centers of two consecutive pulses in the binary signal.

According to a second viewpoint, the present invention provides a driving method characterized by the fact that the method is for driving an element that receives electric energy and generates mechanical or electrical vibration, and it has the following steps of operation: a first step of operation in which a driving signal at a predetermined period or frequency is supplied to the element during a predetermined period, a second step of operation in which the period or frequency of the electric signal generated by the free vibration of the element is measured, a third step of operation to determine whether the period or frequency of the electric signal is contained in a predetermined range, a fourth step of operation in which the following operation is executed: when the period or frequency of the electric signal is not contained in the predetermined range, a predetermined value is added to the period or frequency of the driving signal to set a new period or frequency, and at the same time, a first count value is counted up, a fifth step of operation in which the first count value is compared to a first value, a sixth step of operation in which the operation returns to the first step of operation if the first count value is smaller than the first value, a seventh step of operation in which the following operation is executed: when the period or frequency of the electric signal is within the predetermined range, the difference between the period or frequency of the driving signal and the period or frequency of the electric signal is compared to a predetermined value, and an eighth step of operation in which the following operation is executed: if the difference is smaller than the predetermined value, the driving signal is supplied to the element for a period longer than the predetermined period.

As a preferable scheme, in the eighth step of operation, if the difference is smaller than the predetermined value, the period or frequency of the electric signal is set at the new period or frequency of the driving signal, and at the same time, the driving signal is supplied to the element for a period longer than the predetermined period.

As a preferable scheme, a ninth step of operation also exists in which the following operation is executed: if the first count value matches the first value, a signal indicating abnormality of the element is output.

In addition, a tenth step of operation may also exist in which the following operation is executed: if the difference is not smaller than the predetermined value, the period or frequency of the electric signal is set as the new period or frequency of the driving signal, and the fifth step of operation is executed after the tenth step of operation.

As a preferable scheme, in the eighth step of operation, when the difference is smaller than the predetermined value repeatedly for plural successive rounds, the driving signal is fed to the element for a period longer than the predetermined period.

In addition, the second step of operation is entered after the eighth step of operation.

In accordance with another preferred embodiment of the present invention,

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

According to the present invention, the period or frequency of the free vibration of the element that takes place when supply of the driving signal is stopped is detected, and corresponding to the detection result, the period or frequency of the driving signal is adjusted so that the element is driven at a high efficiency at a frequency similar to the characteristic vibration frequency.

Figure 2:
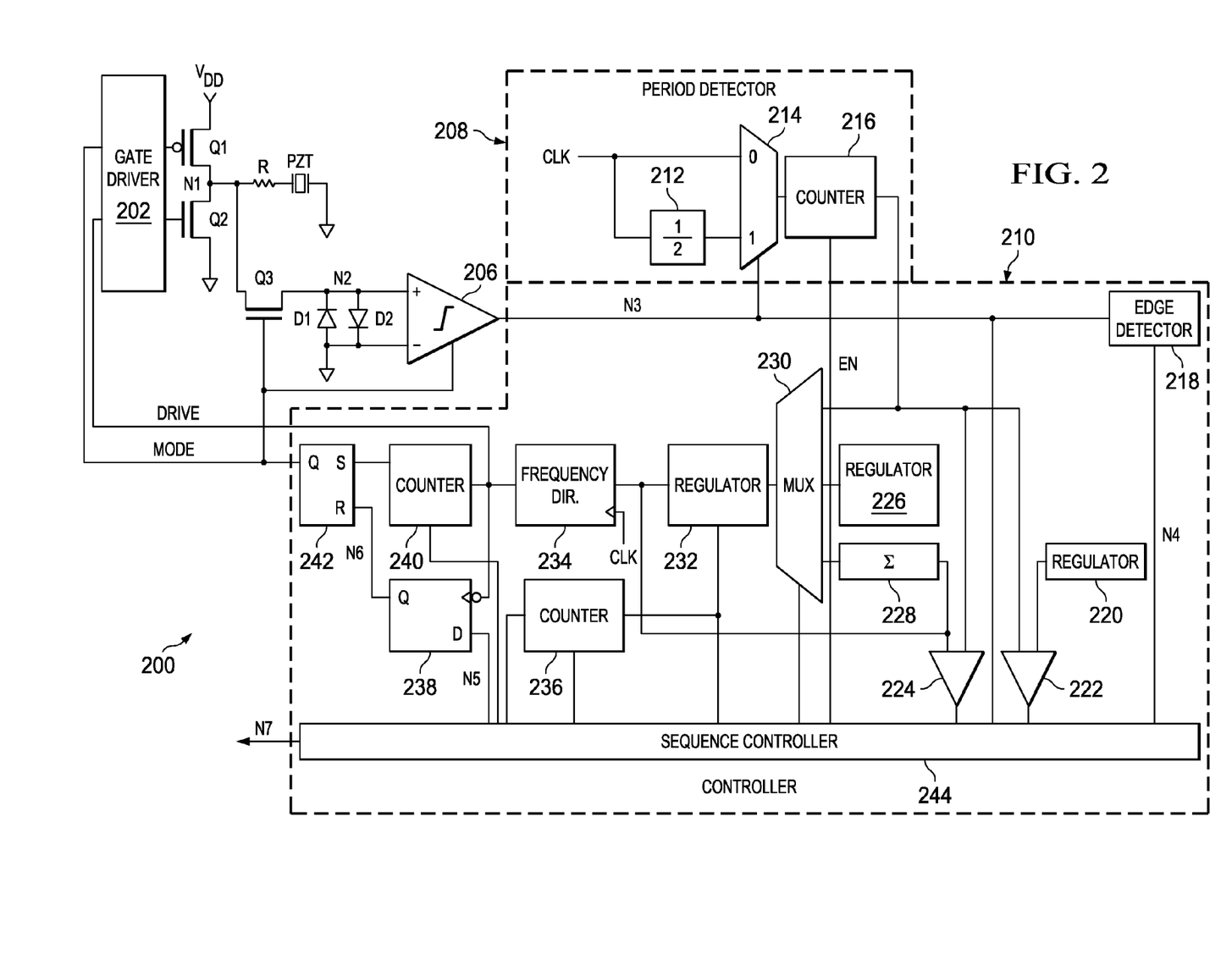
FIG. 2 is a diagram of an example of a driver for a piezoelectric fan in accordance with a preferred embodiment of the present invention.

Referring to FIG. 2 of the drawings, the reference numeral 200 generally depicts an example of a driver for a piezoelectric fan in accordance with a preferred embodiment of the present invention. As can be seen in FIG. 2, driver 200 provides energy to piezoelectric transducer PZT so as to drive it. For example, transducer PZT may be a piezoelectric fan 100. Driver 200 generally comprises transistors Q1, Q2, and Q3 (which are preferably a PMOS transistor, an NMOS transistor, and an NMOS transistor, respectively), resistor R, diodes D1 and D2, comparator 206, period detector 208, and controller 210. Controller 208 is generally comprised of edge detector 218, registers 220, 226, and 232, flip-flops 242 and 238, counters 240 and 236, comparators 224 and 222, adder 228, frequency divider 234, multiplexer or mux 230, and sequence controller 244.

As shown, transistors Q1 and Q2 are coupled in series with one another between power supply VDD and ground to drive the resistor R and transducer PZT. The drains of transistors Q1 and Q2 are commonly coupled to output node N1 and are driven at their respective gates by gate driver 202. Gate driver 202 drives the gates of transistors Q1 and Q2 corresponding to drive and mode signals DRIVE and MODE supplied by controller 210, so that transistors Q1 and Q2 are alternately turned on and off. The switching of these transistors generates a driving signal that is output from the output node N1. Additionally, resistor R and transducer PZT are coupled in series between output node N1 and ground, where resistor R and the parasitic electrostatic capacitance of transducer PZT form a low-pass that suppresses generation of audible sound that accompanies vibration of transducer PZT when driven.

In operation, however, gate driver operates in one of two operation modes (driving mode and measurement mode), which are indicated by mode signal MODE. When mode signal MODE is logic low, gate driver 202 operates in driving mode. In driving mode, gate driver 202 alternately turns "on" transistors Q1 and Q2 based one drive signal DRIVE to that the transducer PZT operates (i.e., as a fan). When mode signal MODE is logic high, gate driver 202 operates in measurement mode. In measurement mode, gate driver 202 turns "off" both transistors Q1 and Q2 so that output node N1 passes into the high impedance state so that transducer PZT can freely vibrate.

Transistor Q3 is also coupled to node N1, inserted into the signal path between node N1 and the positive input terminal of comparator 206. The gate of transistor Q3 is coupled to controller 210 and is controlled by mode signal MODE so that transistor Q3 is "off" in the driving mode and "on" in the measurement mode. During the measurement mode, comparator 206 compares the signal input from transducer PZT via transistor Q3 to ground, outputting binary signal corresponding to the comparison result. Additionally, diodes D1 and D2 are coupled in parallel (with opposite polarity) between the input terminals of comparator 206 so as to restrict the amplitude of the input signal to comparator 206.

In the measurement mode and based on the binary output of comparator 206, the period detector 208 can determine the period of clock signal CLK. The period detector 208 is generally comprised of a divider 212 (which is a divide-by-2 divider), multiplexer or mux 210 and counter 216. In the measurement mode, controller 210 provides a control signal EN to enable the counter 216. The free vibration of transducer generates a signal that is converted to the binary signal seen in FIG. 3. During the logic high periods of the first pulse ($P_1$) and the second pulse ($P_3$) which can be seen in FIG. 3, mux 214 allows the counter 216 to count pulses from divider 216, and during the logic low period $T_M$ between first pulse ($P_1$) and the second pulse ($P_3$), mux 214 allows counter 216 to count pulses from the clock signal CLK. This allows the period detector 208 to determine the period (T) between the centers of consecutive pulses of the binary output of comparator 206 ($P_1/2+P_2+P_1/2$). The period T can then be provided to controller 210.

In the driving mode, controller 210 sets the mode signal MODE to logic low. As a result, corresponding to pulse of drive signal DRIVE, gate driver 202 alternately turns transistors Q1 and Q2 "on" and "off." Thus, a driving signal is supplied to transducer PZT. Additionally, because transistor Q3 is "off," comparator 206 does not receive a signal from node N1.

As a result of the operation in these two modes, controller 210 can adjust the signal applied to transducer PZT. Preferably, controller 210 compares the period of driving signal of the transducer PZT in the driving mode (i.e., the period of the drive signal DRIVE) with the measured period from period detector 208 in the measurement mode. Based on this comparison, controller 11 changes the output period (i.e., cycle number) of driving signal for the transducer PZT in the driving mode. Essentially, the driving mode and measurement mode are alternated, and the period of the drive signal DRIVE is adjusted based on the difference.

In one example, the difference between period of the driving signal of transducer PZT in the driving mode and the measured period from the period detector 208 in the measurement mode exceeds threshold E1. Following the comparison, controller 210 outputs one cycle of drive signal DRIVE in the driving mode. After output of one cycle of drive signal DRIVE, the operating mode is switched by controller 210 to the measurement mode. Thus, controller 210 reduces the output period of drive signal DRIVE and, more frequently, switches the operating mode between the driving mode and the measurement mode. Additionally, when this process is consecutively repeated for a predetermined number of rounds, controller outputs a signal indicating an abnormality in vibration of transducer PZT.

In another example, the difference between period of the driving signal of transducer PZT in the driving mode and the measured period from the period detector 208 in the measurement mode is below threshold E1. Following the comparison, controller 210 sets the output period of drive signal DRIVE to a predetermined number of cycles (e.g., 100 cycles). Thus, controller 210 prolongs the output period of drive signal DRIVE and reduces the frequency for generating the measurement mode.

In operation, controller 210 generates the drive signal DRIVE and the mode signal MODE based at least on part on the output from period detector 208. Register 232 stores setting value of the period T of drive signal DRIVE. Register 232 holds data selected by mux 230 according to control signal from sequence controller 244. Preferably, the sequence controller 244 selects (through mux 230) detected value from period detector 208, lower threshold $T_{MIN}$ of drive signal DRIVE stored in register 226, and the sum of value held in register 232 and an increment value ($\alpha$) obtained in adder 228. This selection can be based at least on part on a comparison by comparator 222 between the standard range of detected values of period detector (stored in register 220) and the detected value from the period detector 208. Additionally, this selection can be based at least in part on a comparison by comparator 224 between the detected value from period detector 208 and the value held in register 232, outputting a signal indicating whether difference exceeds threshold E1. Frequency divider 234 divides clock signal CLK by the frequency dividing number corresponding to input setting value (value stored in register 232) and outputs the frequency divided signal as drive signal DRIVE. Edge detector 218 detects the rising edge and falling edge of the signal output from comparator 206. Counter 240 counts the pulses of drive signal DRIVE, and when the counted value reaches an assigned by sequence controller 244, output signal from counter 240 is changed from 0 to 1, while also resetting the count value to zero. Counter 236 counts the number of refresh rounds of value of register 232, while also resetting it count value to zero when a reset signal is received from sequence controller 244. Flip-flop 238 holds control signal output from sequence controller 244 in synchronization with the falling edge of drive signal DRIVE. Flip-flop 242 sets mode signal MODE to 1 when output signal of counter 240 changes from 0 to 1 and resets mode signal MODE to 0 when the signal from flip-flop 238 becomes 1. The sequence controller 244 controls period detector 208 based on detection signal of edge detector 218 in the measurement mode so that the interval between the $i^{th}$ pulse (i represents an integer of 1 or larger) and the $(i+1)^{th}$ pulse of signal binary signal from comparator 206 is detected.

Figure 3:
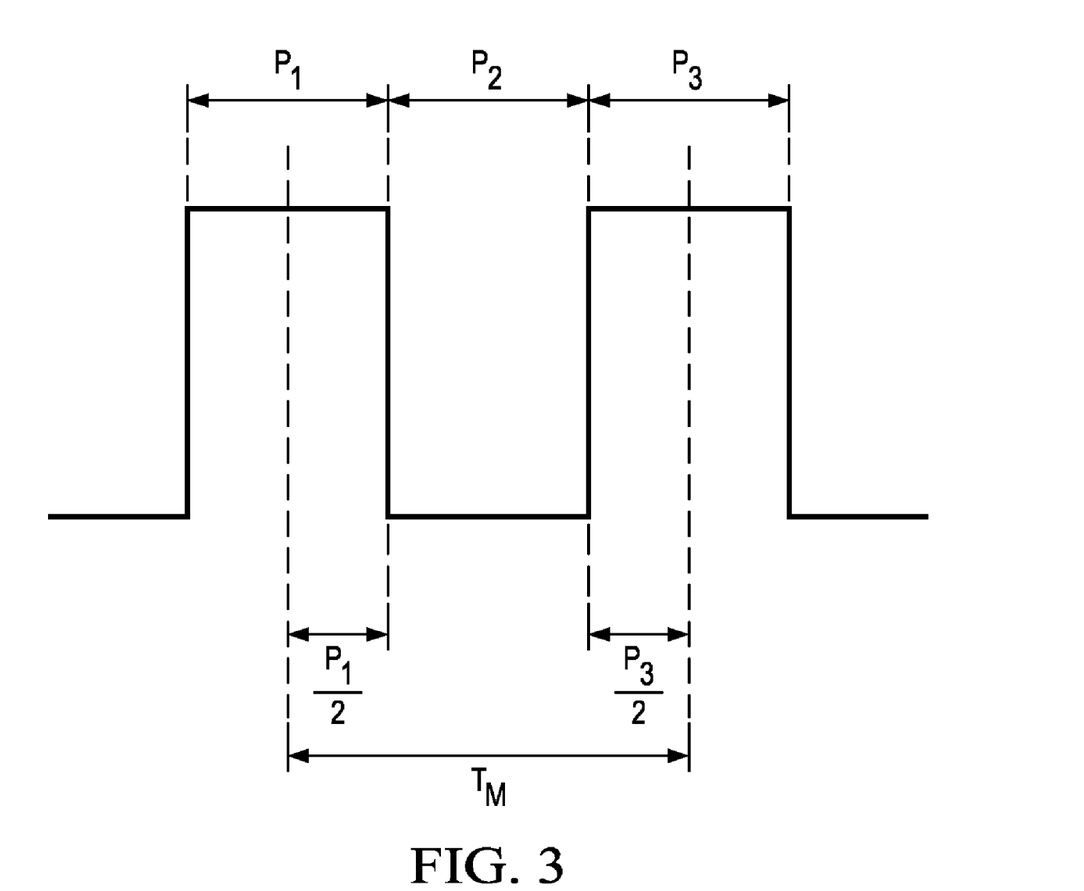
FIG. 3 is a timing diagram for the operation of the period detector of the driver of FIG. 2.

An example operation for the driver 200 can be seen using the timing diagram of FIG. 3. For period detector 208, sequence controller 244 controls counter 216 such that the pulses output from mux 214 in the period from the rising edge of the first pulse ($P_1$) to the falling edge of the second ($P_3$) pulse are calculated. Assuming i=2, sequence controller 244 resets the counted value of counter 216 to zero before moving from the driving mode to the measurement mode, and after shifting to the measurement mode, counter 216 counts between the third edge and the sixth edge of signal from comparator 206. Because signal from comparator 206 is reset to the low level at the start of the measurement mode, the third edge corresponds to the rising edge of the second pulse, and the sixth edge corresponds to the falling edge of the third pulse. After the detection value (from counter 216) is obtained, sequence controller 244 controls mux 230, register 232, and counter 240 corresponding to signals from comparators 224 and 222. When comparator 222 indicates that detected value from period detector 208 is out of standard range, sequence controller 244 starts a sequence for searching for an appropriate value for setting value by gradually increasing setting value from lower threshold $T_{MIN}$. When a new search sequence is started, sequence controller 244 selects lower threshold $T_{MIN}$ stored in register 226 and stores it in register 232. Subsequently, sequence controller 244 selects the data output from adder 228 (which increment the value held in register 232 by value α) and stores it in register 232. Additionally, sequence controller 244 sets the assigned value of counter 240 at loop number 1 in the search sequence. When detected value from period detector 208 falls within the standard range, sequence controller 244 uses the output signal from comparator 224 as a reference. When comparator 224 indicates that the difference between setting value and detected value exceeds threshold E1, sequence controller 244 selects detected value of period detector 208 and stores it in register 232, while assigning a value to counter 240 at loop number 1. On the other hand, when comparator 224 indicates that the difference between setting value and detected value is below threshold E1, sequence controller 244 selects detected value of period detector 208 and stores it in register 232, while assigning a value to counter 240 at loop number 100.

When the assigned value of counter 240 is set to 100, sequence controller 244 resets the counted value of counter 236 to zero. When the assigned value of counter 240 is 1, the number of rounds of refresh of setting value of register 232, that is, the number of rounds of consecutively repeating the driving mode and the measurement mode, is counted by counter 236. When counted value of counter 236 reaches a predetermined value, signal S13 indicating abnormality in vibration of transducer PZT is output under control of sequence controller 244. When setting value of the period of drive signal DRIVE is established, that is, after completion of the search sequence, sequence controller 244 changes control signal (input into flip-flop 238) from 0 to 1. When this control signal becomes 1, at the falling edge of drive signal DRIVE, the output signal from flip-flop 238 becomes 1, which causes mode signal MODE to be reset to 0, and the operating mode is changed from the measurement mode to the driving mode. When the operating mode is switched to the driving mode, sequence controller 244 refreshes the frequency dividing number in frequency divider 234 to setting value Ts of register 232, and resets the counted value of counter 240 to zero.

Figure 4:
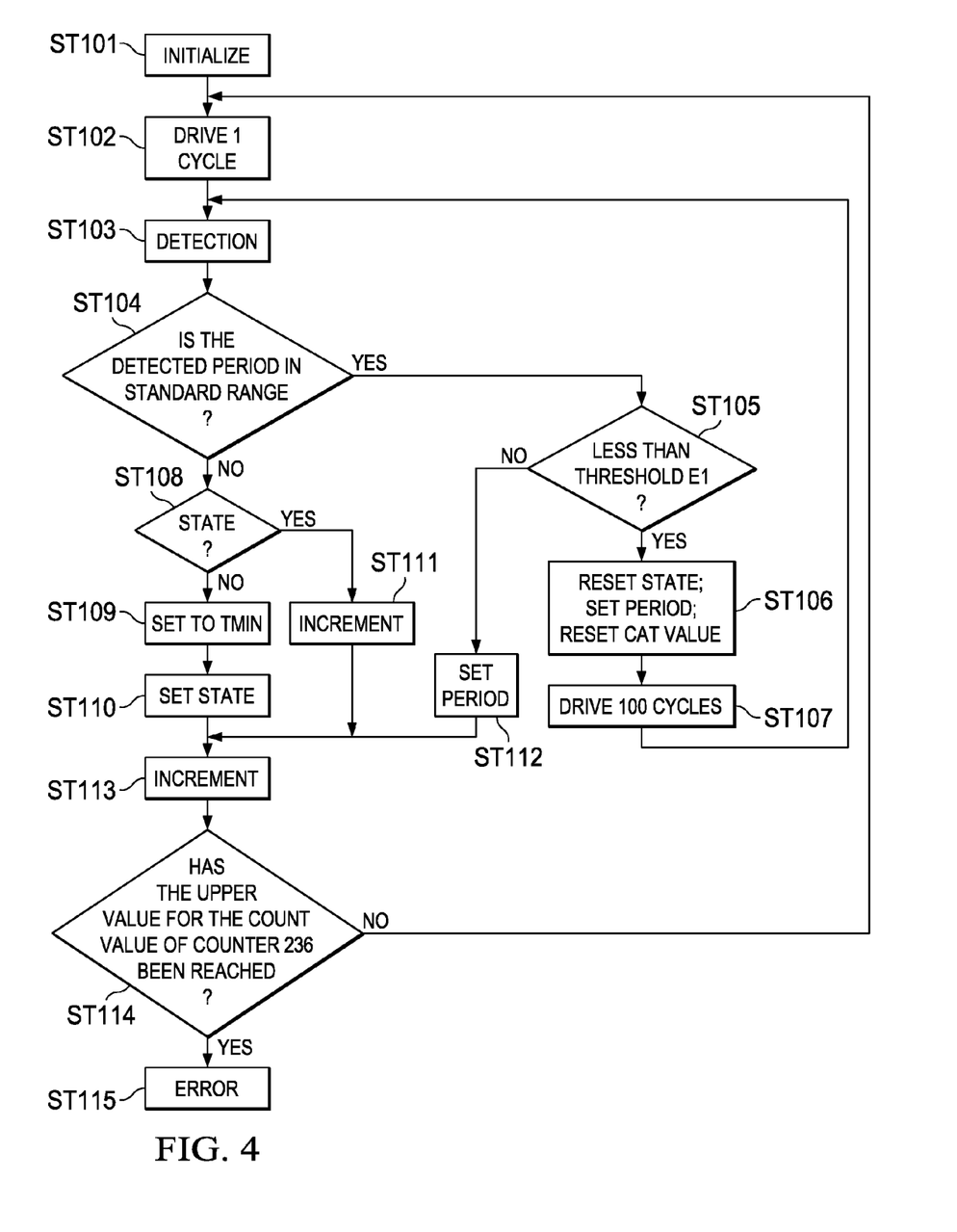
FIG. 4 is a flow chart illustrating the operation of the driver of FIG. 2.

Now turning to FIG. 4, a flow chart of the operation of the driver 200 can be seen. In the first step ST101, sequence controller sets state flag to 1, sets count value for counter 236 to 0, sets mode signal MODE to 1, and sets the value in register 232 to the lower threshold $T_{MIN}$.

After initialization in step ST101, the operating mode of the driver is switched to the driving mode for one cycle in step ST102. In step ST102, the frequency dividing operation of frequency divider 234 and the counting operation of counter 240 are started, and the assigned value of counter 240 is set to 1. When mode signal MODE becomes low or 0, gate driver 202 enters the active state, and transistors Q1 and Q2 are alternately turned ON corresponding to drive signal DRIVE. At output node N1, driving signal is generated corresponding to drive signal DRIVE. Here, transistor Q3 is turned OFF, and comparator 206 is turned OFF. When 1-cycle (1-pulse) driving signal at node N1 is output, count value of counter 240 becomes equal to the assigned value 1. As a result, mode signal MODE becomes 1 or high, and the operating mode is switched from the driving mode to the measurement mode.

After entering the measurement mode, detection occurs in step ST103. In measurement mode, transistors Q1 and Q2 are turned OFF, and node N1 enters the high impedance state. Also, transistor Q3 is turned ON, and comparator 206 is enabled. When supply of driving signal is stopped, under the electric energy received up to that point, transducer PZT freely vibrates. The pressure generated by the free vibration is applied to piezoelectric element 102 of transducer PZT, generating an electric signal having the same period as that of the free vibration. This electric signal is input via transistor Q3 to comparator 206, and it is transformed to binary signal. The period of signal at node N3 corresponds to the period of the free vibration of transducer PZT. In period detector 208, in order to avoid detecting a period with a discontinuous waveform just after transition to the measurement mode, for example, a predetermined number of pulses at the start is excluded from the object of detection.

When detection value is obtained by period detector 208, controller 210 can then make several determinations. In step ST104, controller 210 judges whether detected value is contained in the predetermined standard range. If detected value from period detector 208 is out of standard range, a determination of the state (flag value) is made in step ST108. If flag value 1, the value held within register 232 is incremented by a value a in step ST111. If flag value is 0, a lower threshold $T_{MIN}$ is stored in register 232 in step ST109, and the flag is subsequently set to 1 in step ST110. When setting value of register 232 is refreshed, count value of counter 236 is incremented by only 1 in step ST113, and a determination is made as to whether the count value of counter 236 has reached an upper limit or maximum value in step ST114. If count value of counter 236 has not reached the upper limit, then the process begins again in step ST102. Otherwise, an error is returned in step ST115.

Turning back to step ST104, when detected value is contained in standard range, a determination is made with respect to threshold E1 in step 105. Specifically, a determination as to whether the absolute different between the value held in register 232 and the detected value from period detector 208 exceeds threshold E1 is made. If the difference exceeds threshold E1, detected value is selected as the new setting value to be stored in register 232 in step ST112. That is, detected value of period detector 208 is stored in register 232 selected by mux 230. Otherwise, as this difference falls below threshold E1, flag F is reset to 0, and the search sequence is ended in step ST106. Additionally, count value of counter 236 (number of rounds of refresh of setting value) is reset to zero, and detected value is set as the new setting value (stored in register 232). The assigned value of counter 240 is changed from 1 to 100, and the operating mode is switched to the driving mode in step ST107. Here, in the driving mode, 100 cycles (100 pulses) of continuous driving signal on node N1 are output. Then, after output of the 100 cycles, the operating mode is switched again to the measurement mode in step ST103, and the process is repeated.

Figure 5:
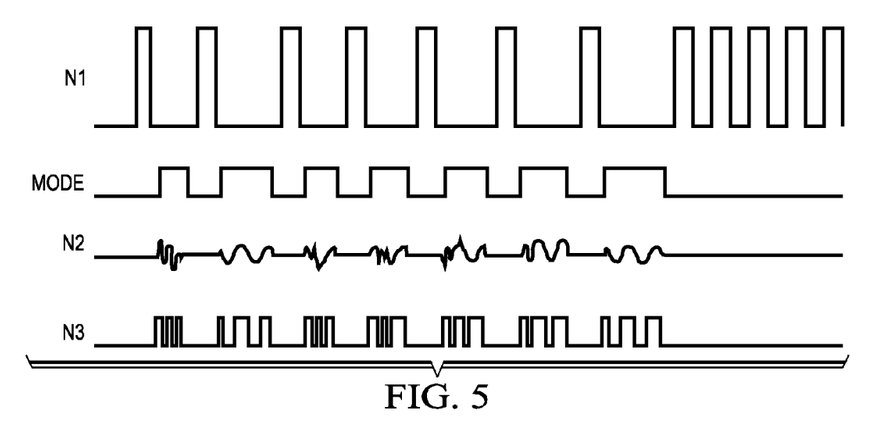
FIG. 5 is a timing diagram for the operation of the driver of FIG. 2.
Figure 6:
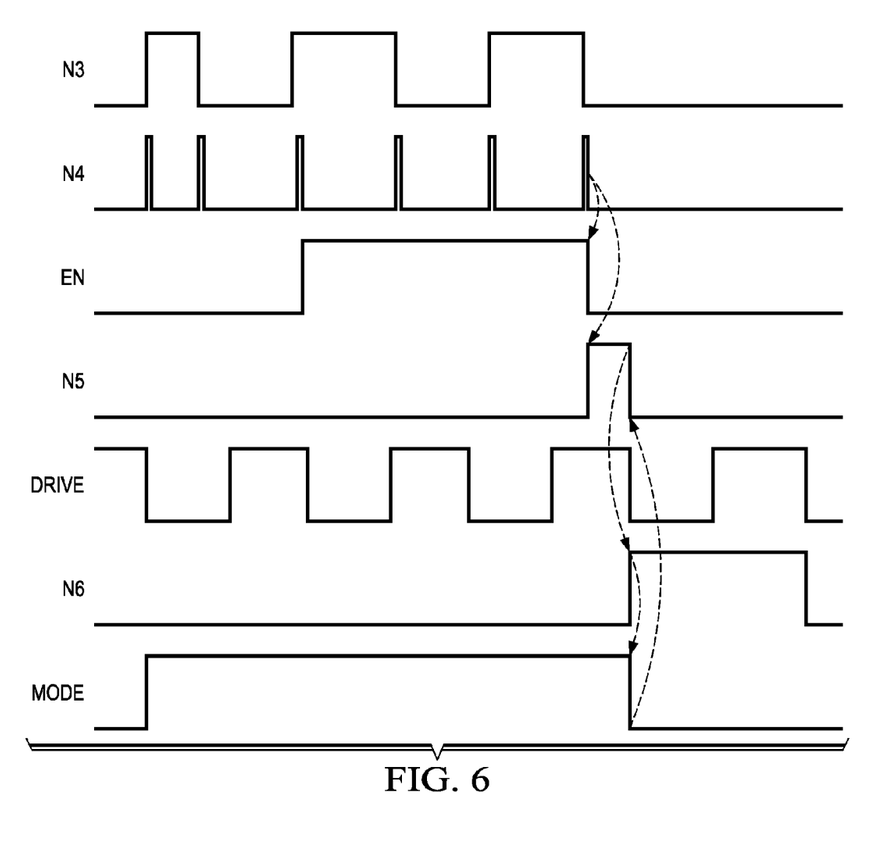
FIG. 6 is a diagram illustrating the phase of the driving signal at the start of the driving mode.

FIG. 5 is a diagram is an example of a timing diagram for various portions of the driver. In particular, the mode signal MODE and the signals at nodes N1, N2, and N3 are shown. Additionally, FIG. 6 is a timing diagram illustrating several signals and nodes within controller 210. In particular, signals MODE, DRIVE, and EN are shown along with the signals at nodes N3, N4, N5, and N6.

Additionally, the period of driving signal S1 in the driving mode is set based on detected value of period detector 208 in the measurement mode just before the driving mode (step ST112 shown in FIG. 4). However, the present invention is not limited to this scheme. As another scheme for embodiment of the present invention, the period of the driving signal may be set based on the detected value of period detector 208 in a series of plural rounds of the measurement mode performed repeatedly until just before the driving mode. For example, one may adopt a scheme in which a digital filter (such as a filter that multiplies a predetermined weighting coefficient to a series of plural detected values and then adds them up) is set to receive as inputs the plural detected values in a series of plural measurement mode performed repeatedly until just before the driving mode, and its output is taken as the setting value of the period of the driving signal.

Additionally, when the driving mode, in which 1-cycle driving signal is output, is repeated continuously for a predetermined number of rounds (when the driving mode and the measurement mode are consecutively repeated for a predetermined number of rounds), signal at node N7 indicating abnormality in vibration of transducer PZT is output. However, the present invention is not limited to this scheme. For example, as another scheme that may be adopted in the present invention, signal output from sequence controller at node N7 is output when the driving mode that outputs a 1-cycle driving signal is executed repeatedly for a predetermined time (when the driving mode and the measurement mode are continuously repeated for a predetermined time).

Additionally, when the difference between setting value of driving signal at node N1 in the driving mode and detected value of the period of free vibration of transducer PZT in the measurement mode is larger than threshold E1, 1-cycle driving signal S1 is output in the next driving mode (in FIG. 4, steps ST105, ST112-ST102). However, the cycle number (part number) can be selected as desired, and it may be 2 or more cycles (2 or more pulses).

Additionally, when the difference between setting value Ts of driving signal S1 in the driving mode and detected value Td of the period of free vibration of transducer PZT in the measurement mode is smaller than threshold E1, 100 cycles of driving signal S1 (100 pulses) in the next driving mode are output (steps ST105-ST107 in FIG. 4). However, this cycle number may be any larger number if the difference exceeds threshold E1.

Additionally, if the difference is smaller than a predetermined threshold, the period of the next driving mode is defined by the number of cycles of the driving signal. However, the present invention is not limited to this scheme. For example, as another scheme that may be adopted in the present invention, the period of the driving mode may also be defined by time. That is, after output of the driving mode for a predetermined time (a time longer than that if the difference exceeds threshold E1), the operating mode is switched to the measurement mode.

Additionally, even if the difference is smaller than the predetermined threshold, the measurement mode is still executed on a regular basis. However, the present invention is not limited to this scheme. For example, as another scheme that may also be adopted in the present invention, if the difference is smaller than a predetermined threshold, the operating mode is kept in the driving mode. In this case, one may also adopt a scheme in which the control part executes the measurement mode under instruction from an upper-level device instead of executing the measurement mode on a regular basis.

Additionally, when the difference between setting value Ts and detected value Td is smaller than threshold E1, the operating mode is switched to the driving mode in which 100 cycles of driving signal (100 pulses) are continuously supplied. However, the present invention is not limited to this scheme. For example, one may also adopt a scheme in which, when the difference between setting value and detected value is continuously smaller than threshold E1 for a predetermined number of rounds (e.g., for two or more rounds), the operating mode is switched to the driving mode, in which 100 cycles of driving signal (100 pulses) are continuously supplied.

Additionally, when detected value is outside the standard range, the period of driving signal in the next round of the driving mode is set at a predetermined lower threshold min (lower threshold of standard range), and then, during the period until the difference falls below threshold E1, when detected value is outside standard range, the period of driving signal in the next round of the driving mode is set at a value larger by increment a than the period of driving signal in the last round of the driving mode (steps ST108, ST109, ST110, ST111). However, the present invention is not limited to this scheme.

For example, as another embodiment of the present invention, the following scheme may be adopted: when the difference between setting value and detected value is larger than threshold E2 that is higher than threshold E1 (that is, when setting value is significantly larger than the optimum value), the period of driving signal in the next round of the driving mode is set at a predetermined lower threshold $T_{MIN}$, and then, during the period until the difference falls below threshold E1, if the difference is over the threshold E2, the period of driving signal S1 in the next round of the driving mode is set to a value larger by increment a than the period of driving signal in the last round of the driving mode.

As another scheme that may also be adopted in the present invention, the lower threshold $T_{MIN}$ is changed to the upper threshold $T_{MIN}$ (upper threshold of standard range), and the increment α is changed to decrement β. That is, one may also adopt a scheme in which setting value of the period is obtained by subtracting decrement β from upper threshold $T_{MAX}$.

In the example, the lower threshold $T_{MIN}$ and upper threshold $T_{MAX}$ are taken as the lower threshold and upper threshold of standard range. However, the present invention is not limited to this scheme. For example, lower threshold $T_{MIN}$ and upper threshold $T_{MAX}$ may be taken as the lower threshold and upper threshold of any range in standard range.

Additionally, setting value Ts of driving signal S1 is increased stepwise by increment a from lower threshold $T_{MIN}$ (step ST111). However, the present invention is not limited to this scheme. For example, one may also adopt a scheme in which, after step ST111 shown in FIG. 4, the following steps are arranged: a step in which whether setting value has reached predetermined upper threshold $T_{MAX}$ is judged, and a step in which setting value is returned to the lower threshold $T_{MIN}$ when setting value reaches upper threshold $T_{MAX}$. In this way, repeated searching for the optimum value of setting value in the range from lower threshold $T_{MAX}$ to upper threshold $T_{MAX}$ is possible.

Similarly, one may also adopt a scheme in which, in the embodiment with stepwise decrease of setting value Ts by decrement β from upper threshold $T_{MAX}$, the following steps are arranged: a step in which whether setting value has reached lower threshold $T_{MIN}$ is judged, and a step in which when setting value reaches lower threshold $T_{MIN}$, setting value is returned to upper threshold $T_{MAX}$. Also in this case, repeated searching of the optimum value of setting value Ts in the range from lower threshold $T_{MIN}$ to upper threshold $T_{MAX}$ is possible.

In addition, when the driving mode in which the driving signal is supplied continuously cannot be switched ON even if searching is executed between lower threshold $T_{MIN}$ and upper threshold $T_{MAX}$, one may change lower threshold $T_{MIN}$, upper threshold $T_{MAX}$ and standard range so that standard range is wider. In this case, threshold E1 may be increased.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a switching node;
a first transistor that is coupled to the switching node, wherein the first transistor has a control electrode;
a second transistor that is coupled to the switching node, wherein the second transistor has a control electrode;
a transducer that is coupled to the switching node;
a gate driver that is coupled to control electrodes of the first and second transistors;
a third transistor that is coupled to the switching node, wherein the third transistor has a control electrode;
a comparator that is coupled to the third transistor and ground;
a period detector that is coupled to the comparator; and
a controller that is coupled to the gate driver, the control electrode of the third transistor, and the gate driver, wherein the controller controls the gate driver with a drive signal so as to drive the transducer with the first and second transistors in a first mode, and wherein the controller actuates the third transistor in a second mode so that the period detector measures the period of oscillation of the transducer, and wherein the controller adjusts the drive signal so as to generally match the natural frequency of the transducer.

2. The apparatus of claim 1, wherein the period detector further comprises:
a divider that receives a clock signal;
a multiplexer having a first input terminal, a second input terminal, a selection terminal, and an output terminal, wherein the first input terminal of the multiplexer receive the clock signal, and wherein the second input terminal of the multiplexer is coupled to the divider, and wherein the selection terminal of the multiplexer is coupled to the comparator; and
a counter that is coupled to the multiplexer and the controller.

3. The apparatus of claim 1, wherein the controller further comprises:
an edge detector that is coupled to the comparator; and
a sequence controller that is coupled to the edge detector.

4. The apparatus of claim 1, wherein the controller further comprises:
a first register that stores a lower threshold;
an adder that increments by a constant value;
a multiplexer having a first input terminal, a second input terminal, a third input terminal, a selection terminal, and an output terminal, wherein the first input terminal of the multiplexer is coupled to the period detector, and wherein the second input terminal of the multiplexer is coupled to the first register, and wherein the third input terminal of the multiplexer is coupled to the adder;
a second register that is coupled to the output terminal of the multiplexer and the adder;
a first counter that is coupled to the register;
a frequency divider that is coupled to the second register and the gate driver and that receives a clock signal;
a second counter that is coupled to the frequency divider;
a first flip-flop that is coupled to the frequency divider;
a second flip-flop that is coupled to the second counter, the first flip-flop, and the gate driver; and
a sequence controller that is coupled to the select terminal of the multiplexer, the second register, the first counter, the second counter, and the first flip-flop.

5. An apparatus comprising:
a switching node;
a first transistor that is coupled to the switching node, wherein the first transistor has a control electrode;
a second transistor that is coupled to the switching node, wherein the second transistor has a control electrode;
a transducer that is coupled to the switching node;
a gate driver that is coupled to control electrodes of the first and second transistors;
a third transistor that is coupled to the switching node, wherein the third transistor has a control electrode;
a first comparator that is coupled to the third transistor and ground;
a period detector having:
a divider that receives a clock signal;
a first multiplexer having a first input terminal, a second input terminal, a selection terminal, and an output terminal, wherein the first input terminal of the first multiplexer receive the clock signal, and wherein the second input terminal of the first multiplexer is coupled to the divider, and wherein the selection terminal of the first multiplexer is coupled to the first comparator; and
a first counter that is coupled to the first multiplexer;
a controller having:
an edge detector that is coupled to the first comparator;
a first register that stores a standard range value;
a second comparator that is coupled to the first counter and the first register;
a second register that stores a lower threshold;
an adder that increments by a constant value;
a multiplexer having a first input terminal, a second input terminal, a third input terminal, a selection terminal, and an output terminal, wherein the first input terminal of the multiplexer is coupled to the first counter, and wherein the second input terminal of the multiplexer is coupled to the second register, and wherein the third input terminal of the multiplexer is coupled to the adder;

a third register that is coupled to the output terminal of the multiplexer and the adder;
a second counter that is coupled to the register;
a frequency divider that is coupled to the third register and the gate driver and that receives a clock signal;
a third counter that is coupled to the frequency divider;
a first flip-flop that is coupled to the frequency divider;
a second flip-flop that is coupled to the second counter, the first flip-flop, and the gate driver;
a third comparator that is coupled to the third register and the first counter; and
a sequence controller that is coupled to the select terminal of the multiplexer, the third register, the first counter, the second counter, the third counter, the second comparator, the third comparator, and the first flip-flop.

6. The apparatus of claim 5, wherein the apparatus further comprises:
a first diode coupled to the first comparator; and
a second diode coupled to the first comparator.

* * * * *